United States Patent [19]

Adan

[11] Patent Number: 5,198,379
[45] Date of Patent: Mar. 30, 1993

[54] METHOD OF MAKING A MOS THIN FILM TRANSISTOR WITH SELF-ALIGNED ASYMMETRICAL STRUCTURE

[75] Inventor: Alberto O. Adan, Tenri, Japan

[73] Assignee: Sharp Kabushiki Kaisha, Osaka, Japan

[21] Appl. No.: 899,932

[22] Filed: Jun. 17, 1992

Related U.S. Application Data

[63] Continuation of Ser. No. 679,273, Apr. 2, 1991, abandoned.

[30] Foreign Application Priority Data

Apr. 27, 1990 [JP] Japan .................... 2-113833

[51] Int. Cl.$^5$ .......................... H01L 21/335
[52] U.S. Cl. ........................ 437/41; 437/21; 437/44; 437/46; 437/984
[58] Field of Search ............... 357/23.4, 23.7, 23.14; 437/40, 41, 44, 46, 984, 21, 83, 84; 148/DIG. 150

[56] References Cited

U.S. PATENT DOCUMENTS

| | | | |
|---|---|---|---|
| 4,232,327 | 11/1980 | Hsu | 357/23 |
| 4,373,254 | 2/1983 | Blumenfeld | 437/21 |
| 4,751,196 | 6/1988 | Pennell et al. | 437/84 |
| 4,882,295 | 11/1989 | Czubatyj et al. | 437/46 |
| 4,920,391 | 4/1990 | Uchida | 357/23.4 |
| 4,929,991 | 5/1990 | Blanchard | 357/23.4 |
| 4,980,308 | 12/1990 | Hayashi et al. | 357/23.7 |
| 4,996,575 | 2/1991 | Ipri et al. | 357/23.7 |
| 5,001,528 | 3/1991 | Bahraman | 357/23.7 |
| 5,040,043 | 8/1991 | Ohno et al. | 357/23.4 |
| 5,047,360 | 9/1991 | Nicholas | 437/40 |

FOREIGN PATENT DOCUMENTS

| | | |
|---|---|---|
| 0038133 | 10/1981 | European Pat. Off. |
| 58-201360 | 11/1983 | Japan ........ 437/21 |
| 63-204769 | 8/1988 | Japan . |

OTHER PUBLICATIONS

"A 0.1 µA Standby current, Bouncing-Noise-Immune 1Mb SCRAM", Ando et al., Nikkei Microdevices, Sep. 1988, pp. 123-130 & translation pp. 49-50.
"Characteristics of Offset-Structure Polycrystalline-Silicon Thin-Film Transistors", Tanaka et al., *IEEE Electron Device Letters*, vol. 19, No. 1, Jan. 1988, pp. 23-25.
Ueda et al., "A 5 nm Thick Ultra-Thin Double-Grated ...", *Japanese J. Appl. Phys.*, Ext. Abs. 22nd Conf., 1990, pp. 1195-1196.

*Primary Examiner*—T. N. Quach
*Attorney, Agent, or Firm*—Nixon & Vanderhye

[57] ABSTRACT

A semiconductor thin film formed over a substrate and having drain and source regions each being of a conductivity type and a channel region of another conductivity type defined between the drain and source regions, a gate electrode(s) formed over and/or below the channel region of the semiconductor thin film through an insulating layer(s), a pair of electrodes being connected to the drain and source regions of the semiconductor thin film, in which said source region is placed in a self-aligned manner and adjoined to said channel region, while a drain-offset region is defined between said channel region and said drain region in a self-aligned manner.

9 Claims, 9 Drawing Sheets

METHOD OF MAKING A MOS THIN FILM TRANSISTOR WITH SELF-ALIGNED ASYMMETRICAL STRUCTURE

This is a continuation of application Ser. No. 07/679,273, filed Apr. 2, 1991, now abandoned.

BACKGROUND OF THE INVENTION

1. Field of the Invention

This invention relates to a metal oxide semiconductor thin film transistor (MOS thin film transistor), and more particularly to a MOS thin film transistor comprising a polysilicon layer and a SOI structure. The thin film transistor of the present invention is useful particularly as a load device for Static Random Access Memory (SRAM).

2. Description of the Related Art

MOS thin film transistors (called hereunder MOS-TFT) are widely used in large size LSI for LCD (Liquid Crystal Displays) and, as load devices, in Static Random Access Memories (SRAMs). These devices are mainly composed of a polysilicon thin film formed by deposition and therefore have defects of very high density in the film. As a result, leakage current through P-N junction observed in the film is much larger than that obtained in single crystals.

Figures 5A, 5B:
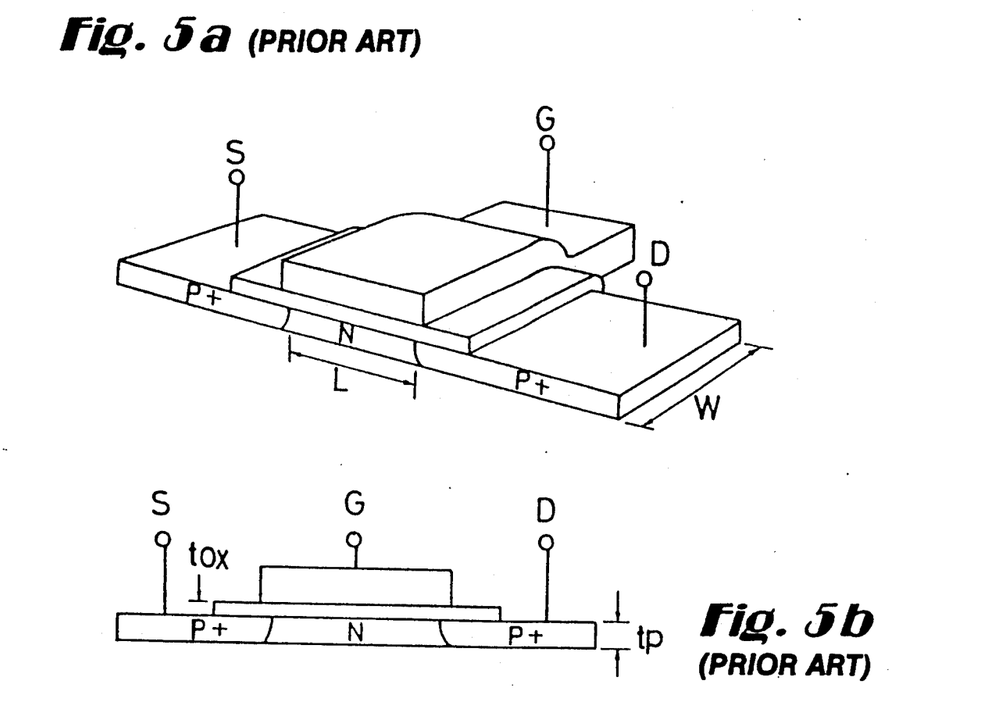
FIGS. 5(a) and 5(b) are sectional views each showing a basic structure of a conventional MOS-TFT and FIG. 5(c) is a graph showing a drain current-gate voltage characteristic (Id-Vgs), thereof.
Figure 5C:
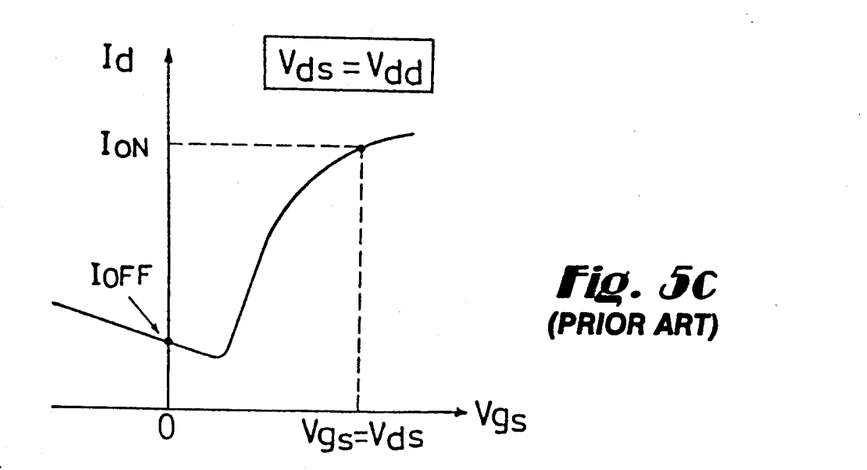
Figure 6A:
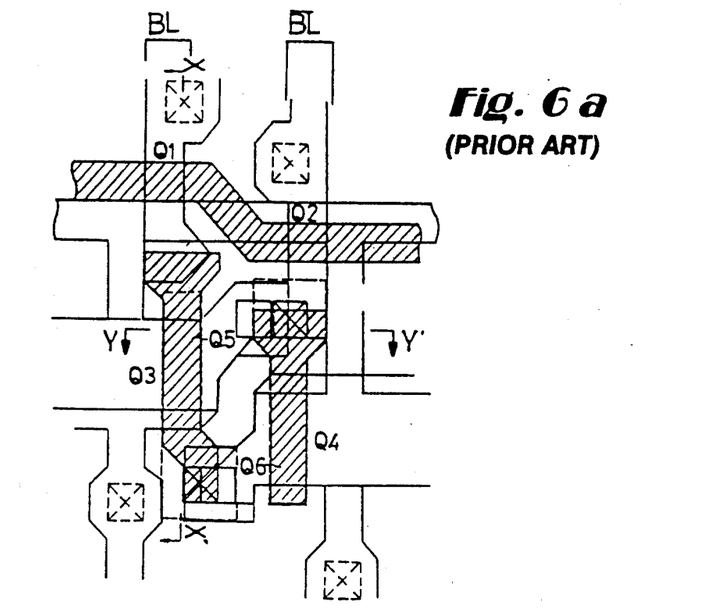
FIGS. 6(a)–6(d), 7(a)–7(e), and 8(a)–8(b) are sectional views each concretely showing a construction of the conventional MOS-TFT.
Figure 6B:
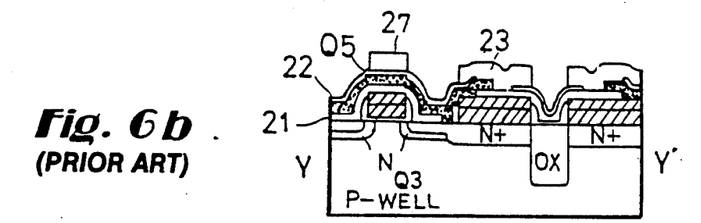
Figure 6C:
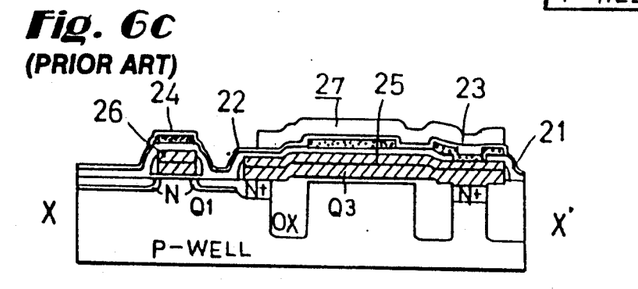
Figure 6D:
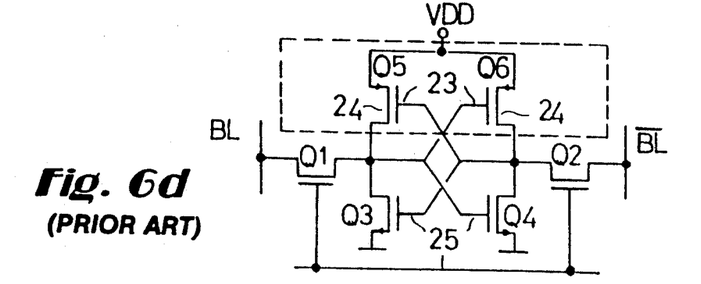

A typical structure of polysilicon MOS-TFT and drain current-gate voltage characteristic (Id-Vgs) thereof are shown in FIGS. 5(a)–(c), wherein S is a source, G is a gate, and D is a drain. Off current (I Off) is defined by the drain current observed at a zero gate voltage (Vgs=0) with a nominal drain-source voltage (Vds=Vdd), and On current (I ON) is defined by the drain current (Id) observed at a nominal gate and drain-source voltage (Vgd=Vds=Vdd).

The OFF current, i.e., leakage current, depends in a complicated way on the recombination-generation mechanism in the drain depletion region. In addition, in polysilicon, or semiconductor films with high level of crystalline defects, this mechanism is enhanced in the depletion region by the drain-gate electric field. The dependence of the OFF current can be represented by the following equation.

$$I_{OFF} = qkT\pi\sigma v_{th} n_i (N_{TS}/S_g) W t_p(\epsilon_S E_o/q N_d) \exp(E_m/E_o)^\nu \quad [I]$$

where:

| | | | |
|---|---|---|---|
| q: | Electronic charge | $\sigma$: | Effective capture cross section |
| k: | Boltzman constant | | |
| T: | Absolute Temperature | $V_{th}$: | Thermal velocity |
| $N_{TS}$: | Traps density (eV/cm$^2$) | $n_i$: | Semiconductor intrinsic carrier concentration |
| W: | Transistor channel width | $S_g$: | Polysilicon grain size |
| $\epsilon_S$: | Dielectric Constant | $t_p$: | Polysilicon thickness |
| Nd: | Donor concentration | Eo: | Constant (1 × 10$^5$ V/cm) |
| $\nu$: | exponent factor (~½) | Em: | Depletion layer maximum electric field |

The above maximum electric field (Em) can be expressed by $$Em = E_1 + E_2$$

$$E_1 = \sqrt{2q} N_{eff} V_d / \epsilon_{S1}$$

$$E_2 = \alpha[(C_{ox}/\epsilon_S)(Vgs - Vds - V_{FB})]$$

wherein $\alpha$ is a fringing field factor (~0.5), and $C_{ox}$ is the transistor gate oxide capacitance per unit area. The effect of the electric field Em is given by the exponential enhancement factor: $Fe = \exp(Em/Eo)^\nu$, and this exponential dependence with the gate and drain voltages strongly increases the OFF current of the device.

For applications requiring Static Random Access Memory (SRAMs) to operate with battery, it is essential to have a very low standby power dissipation. For this purpose, such a polysilicon PMOS TFT has been proposed as the load device in the SRAM cell as shown in FIGS. 6(a)–(d) being a plan view, a sectional view taken from the line Y—Y', a sectional view taken from the line X—X', and a diagram of the equivalent circuit, respectively. In the Figures, reference numeral 21 shows a first intermediate oxide film, 22 a second intermediate oxide film, 23 a third polysilicon layer, 24 a second polysilicon layer, 25 a first polysilicon layer, 26 a WSi$_x$ layer, and 27 a P-MOS FET, and Q1 to Q6 specific portions constituting the device.

However, for high density memory, with more than 1 Megabit capacity, a 1 μA total standby current should be specified. This requires that the OFF current of the polysilicon PMOS TFT to be less than 0.1 pA. To meet this requirement and in accordance with the equation [I], various attempts have been made for improving the quality of the polysilicon film by using such a growing technique as enabling a film formation with a larger grain size (Sg ~ 1 μm). In this respect, a very thin polysilicon film (tp ~ 10 nm) has been formed and proposed to use for the device. However, such a film is very difficult to be produced with good reproductivity in mass production.

Figures 7A, 7C:
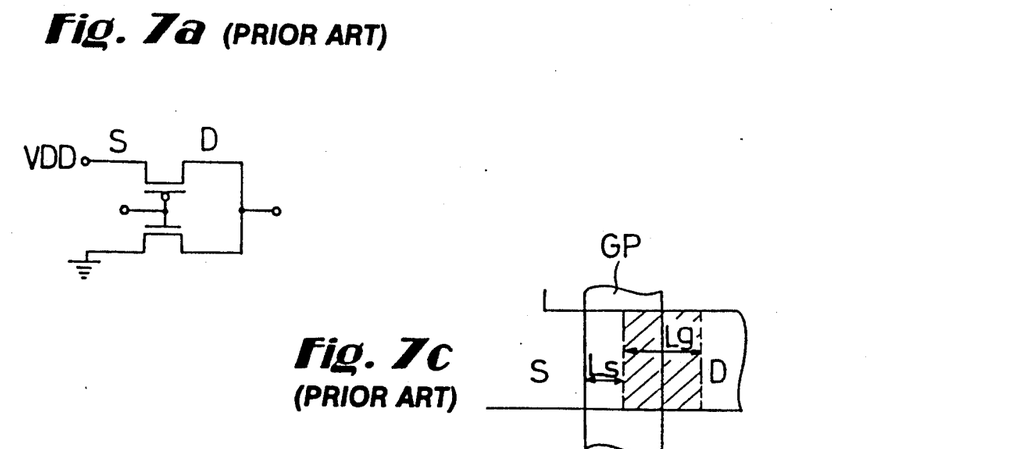
Figure 7B:
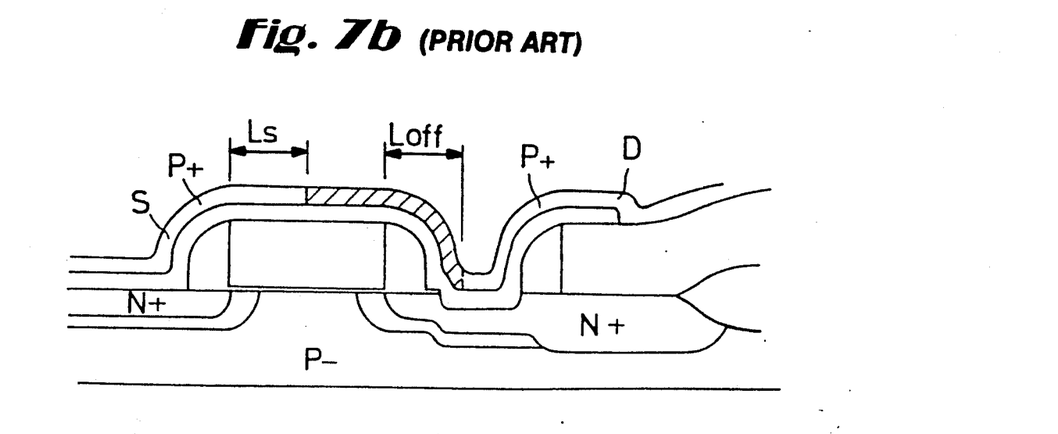
Figure 7D:
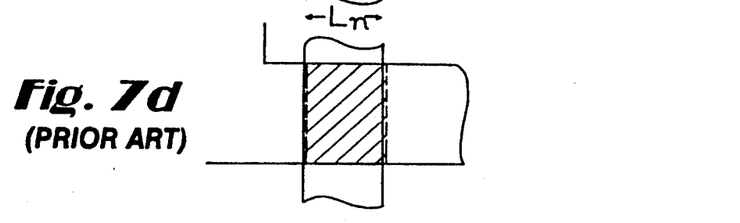
Figure 7E:
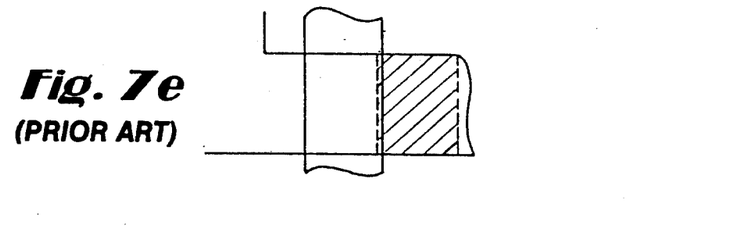

Another proposal to reduce the OFF current is to apply the drain-offset structure as shown in FIGS. 7(a) and (b). In this case, the TFT channel region must be defined directly by the pattern of a photoresist mask, because the gate electrode is under the TFT channel, or the device body. The problem with this technique is the difficulty to align the channel with the underlying gate electrode, specially in submicron size devices as required in high density SRAM. As illustrated in FIG. 7(c), supposing the bulk NMOS transistor of being minimum channel length (Ln), the alignment tolerance is approximately DM = Ln/2. That is, the channel length of the polysilicon PMOS transistor, under the gate (GP), will vary between 0 and Ln (See FIGS. 7(d) and (e)).

Figure 8A:
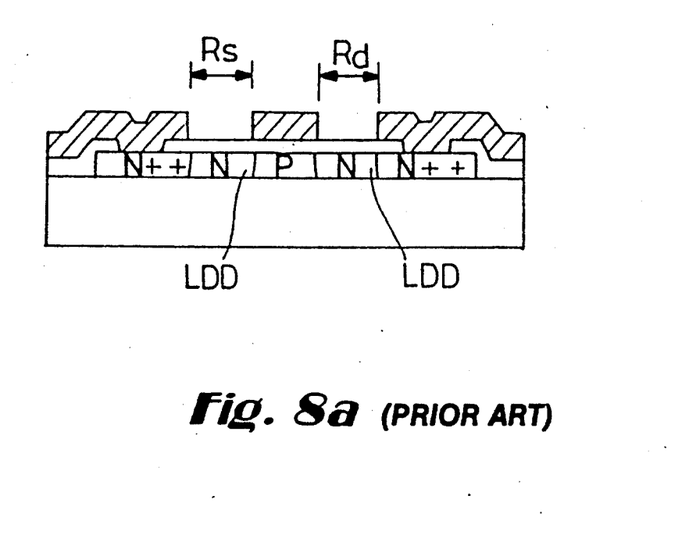
Figure 8B:
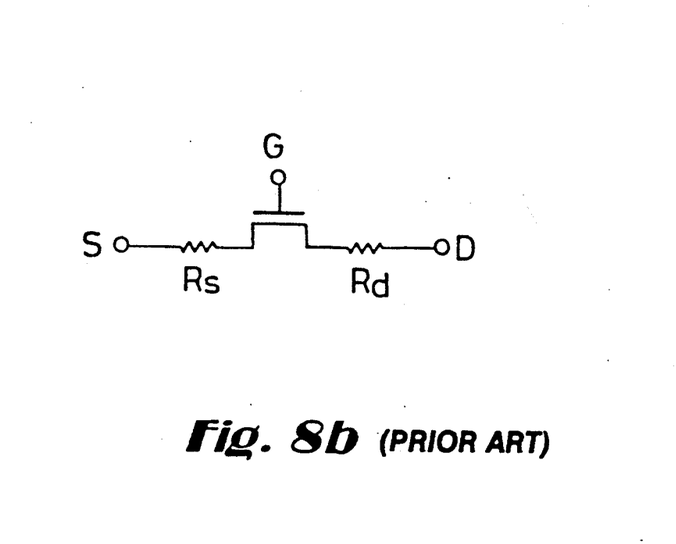

Also, an LDD (Lightly Doped Drain) structure with source and drain-offset ($R_s$ and $R_d$ as shown in FIGS. 8(a) and (b)) is proposed to reduce OFF current and improve the ON/OFF ratio. This structure is symmetric, in the sense that both the source and drain are lightly doped regions. However, this creates a series resistance with the source electrode which reduces the transistor drain ON current.

SUMMARY OF THE INVENTION

The invention has been achieved under the above circumstances. An object of the invention is to provide a new MOS thin film transistor which does not require a very thin film difficult to be produced and comprises a TFT structure having a new self-aligned and asymmetrical drain-offset structure with lower OFF current.

According to the present invention, there is provided a MOS thin film transistor which comprises:

a semiconductor thin film formed over a substrate and having drain and source regions each being of conductivity type and a channel region of another conductivity type defined between the drain and source regions, a gate electrode(s) formed over and/or below the channel region of the semiconductor thin film through an insulating layer(s), a pair of electrodes being connected to the drain and source regions of the semiconductor thin film, in which said source region is placed in a self-aligned manner and adjoined to said channel region, while a drain-offset region is defined between said channel region and said drain region in a self-aligned manner.

The thin film transistor (TFT) of the present invention has an asymmetrical drain-offset structure. According to the structure, (a) the maximum electric field, at the drain reverse biased junction depletion layer, generated with a junction by inversion voltage, is decreased due to the drain-offset between the gate electrode and the drain region, and therefore (b) the field enhancement factor and the OFF current can be reduced. Also, the self-aligned source region ensures the direct application of the gate voltage to the channel region without causing ON current reduction by the parasitic source resistance, and (c) the self-aligned drain-offset region precisely defines the distance between the gate and drain electrodes which results in simplifying the steps in the fabrication of the TFT device.

DETAILED DESCRIPTION OF THE PREFERRED EMBODIMENTS

Figure 1:
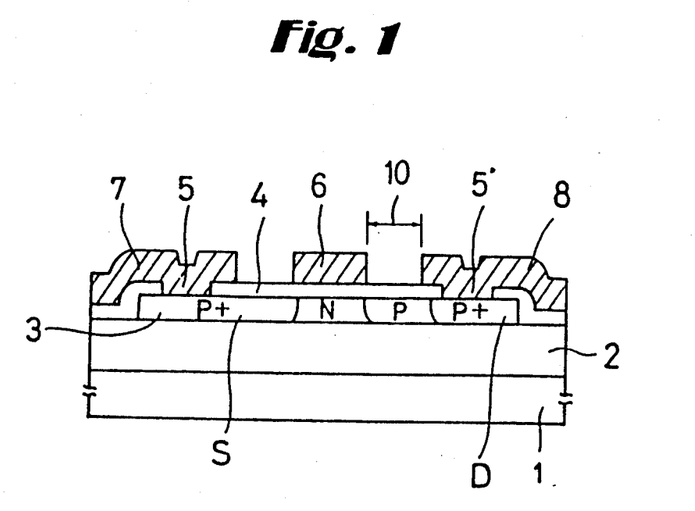
FIGS. 1 to 3 are sectional views each showing a structure of an example of the thin film transistor of the present invention.
Figure 2:
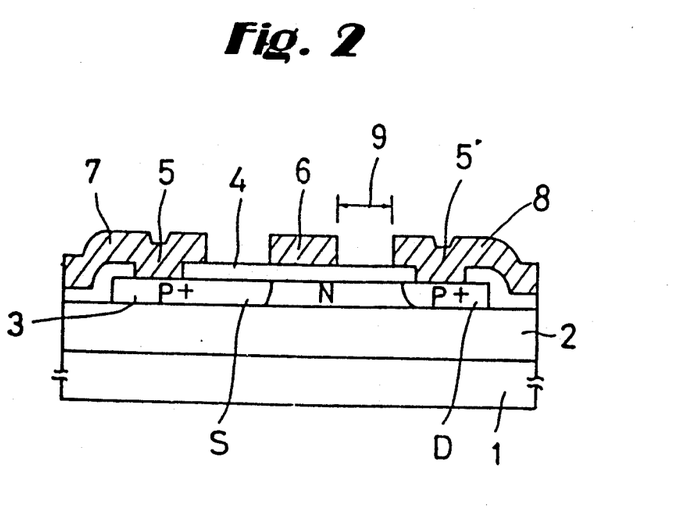
Figure 3:
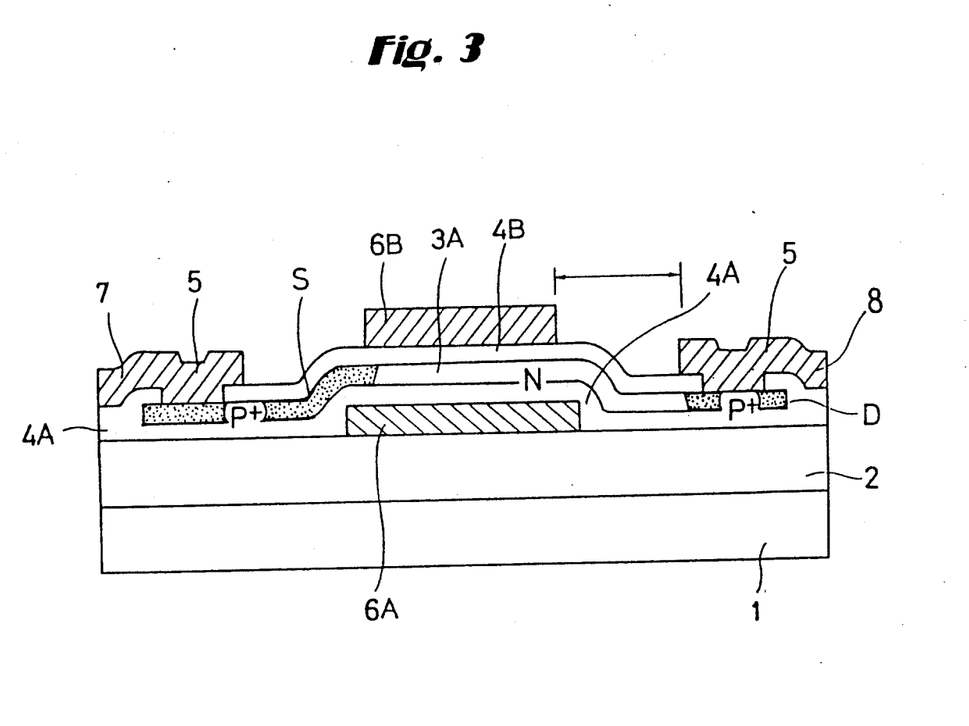

Typical MOS thin film transistors of single gate type with self-aligned asymmetrical drain-offset structure of the present invention are illustrated in FIGS. 1 and 2. The thin film transistor may be a double gate TFT as shown in FIG. 3.

The thin film transistor of the present invention may be NMOS or PMOS type. Hereinafter, a PMOS type TFT as shown in FIG. 2 is typically illustrated.

As shown, the PMOS-TFT of an example of the present invention comprises a substrate 1 made of a semiconductor or an insulating material such as quartz, on which an insulating layer 2 (made, for example, of $SiO_2$, SiN and the like) is formed by CVD process or thermal growth. A semiconductor thin film transistor body 3 (for example, a polysilicon layer) is deposited on the insulating layer 2 and a MOS gate oxide layer 4 is also deposited by CVD process or thermal growth. Contact holes 5 and 5' are made in the gate oxide layer 4 by etching, and the film (3) is heavily doped P-type through these holes by ion implantation of Boron ions.

A top electrode layer made of either polysilicon or metal is deposited and patterned to form the gate, source and drain electrodes 6, 7 and 8, respectively. By using a photoresist mask, which overlaps the gate and drain electrodes, ion implantation (boron) is performed to form a self-aligned source region S and drain offset region 9 as shown in FIG. 2. By removing the photoresist and performing an additional low concentration boron ion implantation, an asymmetrical LDD offset structure (LDD region 10) is formed as shown in FIG. 1.

Characteristics of the above TFT structure are: (a) the top gate electrode configuration, (b) the offset region of low concentration p-type or n-type semiconductor between the gate and drain, (c) High concentration doping of the drain through the contact hole, and (d) the source-gate self-aligned structure with heavily doped source to reduce parasitic source series resistance.

It is in general suitable that the thickness of the body 3 be about 20 to 60 nm and the width be about 0.5 to 1.0 $\mu$m, the width of the gate electrode be about 0.6 to 2 $\mu$m, and the width of the drain-offset region be about 0.5 to 1 $\mu$m.

Further, in the FIGS. 1 and 2, the concentrations of impurity are suitably about $10^{14}$ to $10^{15}/cm^2$ for the $P^+$-type source and drain regions, about $10^{12}$ to $10^{13}/cm^2$ for the N-type channel region and the N-type drain-offset region, and about $10^{12}$ to $10^{13}/cm^2$ for the P-type drain-offset region.

EXAMPLES

Next, the self-aligned asymmetrical drain-offset MOS TFT of the present invention is detailed with referring a fabrication process of a double gate TFT as shown in FIGS. 4(a) to (g).

Figure 4A:
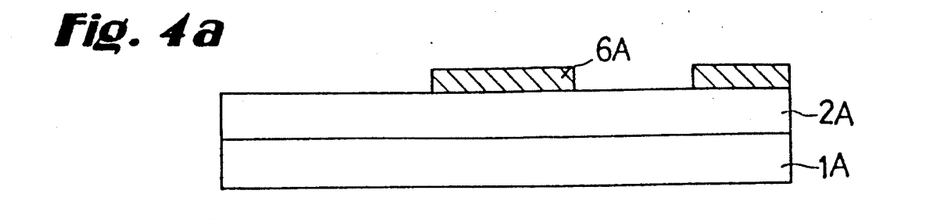
FIGS. 4(a)–4(h) are sectional views sequentially showing a fabrication process of the thin film transistor of the present invention.

First, as shown in FIG. 4(a), on a silicon substrate 1A, an insulating silicon oxide layer 2A (about 0.5 $\mu$m in thickness) is grown or deposited by CVD process and a bottom gate electrode 6A (polysilicon, about 0.3 $\mu$m in thickness) is deposited by LPCVD process and patterned by photoetching.

Figure 4B:
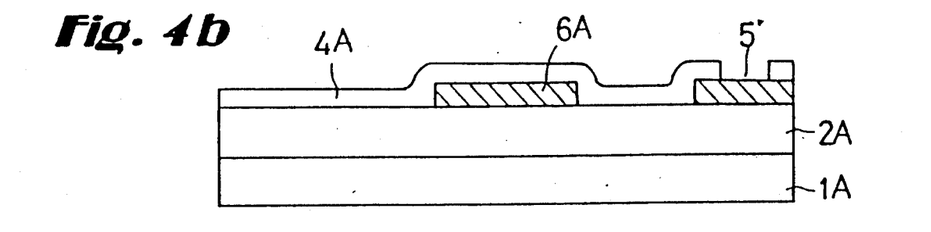
Figure 4C:
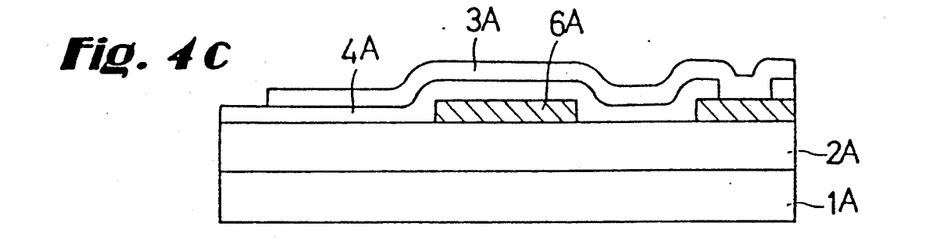

Then, as shown in FIG. 4(b), a silicon oxide layer 4A (about 50 nm in thickness) is thermally grown or deposited by CVD process to form a dielectric for the bottom electrode 6A, and a contact hole 5' is made by photoetching. Thereafter, a second polysilicon layer 3A (about 50 nm in thickness) is deposited and patterned by photoetching to form a polysilicon transistor body as shown in FIG. 4(c).

Figure 4D:
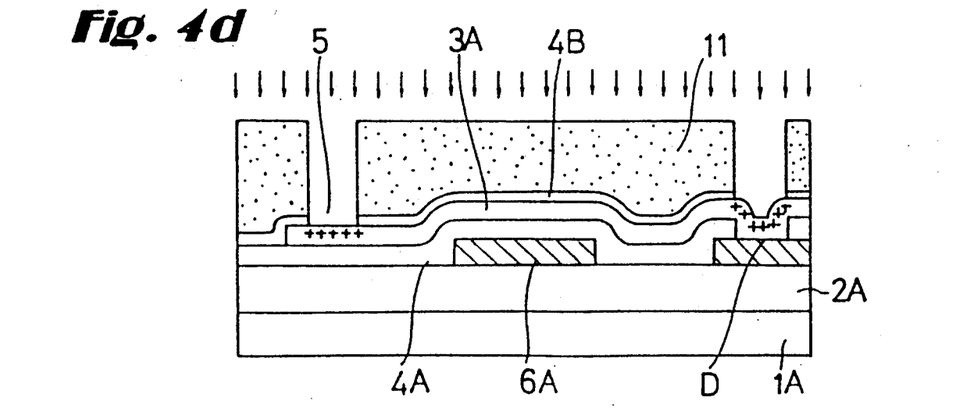

Next, an oxide layer 4B (about 30 nm in thickness) is thermally grown or deposited by CVD process to form a dielectric for top gate electrode, and a contact hole 5 is made by photoetching using photoresist mask 11. After this etching, the photoresist mask 11 is used as mask and ion implantation is performed as shown in FIG. 4(d) to dope the transistor drain region D and a part of the source region, typically with about $5 \times 10^{15} cm^{-2}$ concentration of boron ions. After this implantation, the photoresist 11 is removed.

Alternatively, the ion implantation of the drain region D may be carried out before the formation of the hole 5' in the oxide layer 4B. In this case, the photoresist mask 11 is delineated, boron ions are implanted through the oxide layer 4B, appropriately inhibiting channeling. After implantation, contact hole 5', in the oxide layer 4B, are opened.

Figure 4E:
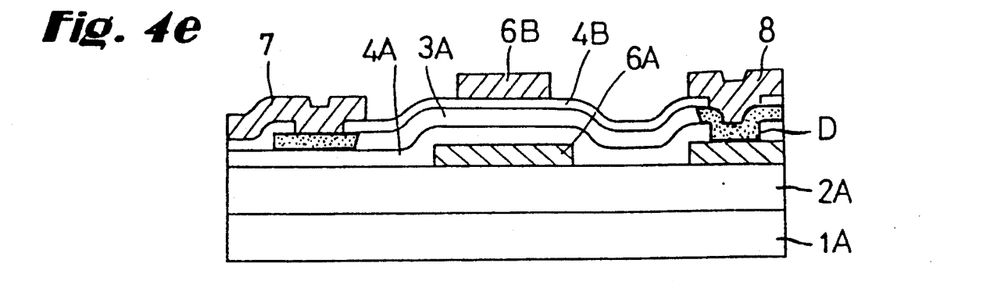
Figure 4F:
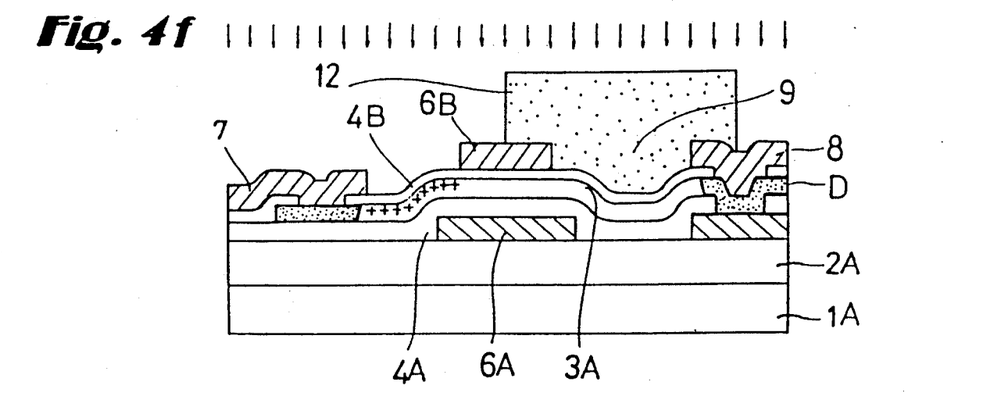
Figure 4G:
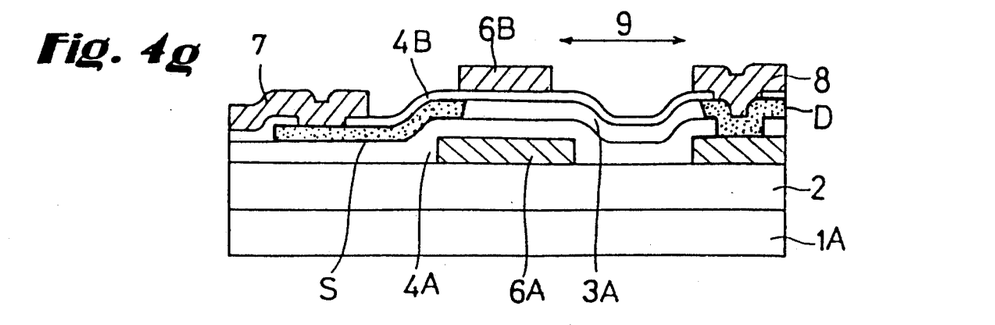

Then, as shown in FIG. 4(e), a layer of metal or a third polysilicon layer is deposited and patterned by photoetching to form a polysilicon top gate electrode 6B, a source electrode 7 and a drain electrode 8. As shown in FIG. 4(f), a photoresist mask 12 is then formed to cover the drain-gate offset region 9 and a Boron ion implantation with high concentration ($\sim 5 \times 10^{15}$ cm$^{-2}$) is performed to form a self-aligned source region S (FIG. 4(g)). Then, the photoresist mask 12 is removed to complete the formation of the self-aligned asymmetrical drain-offset TFT of the present invention.

Figure 4H:
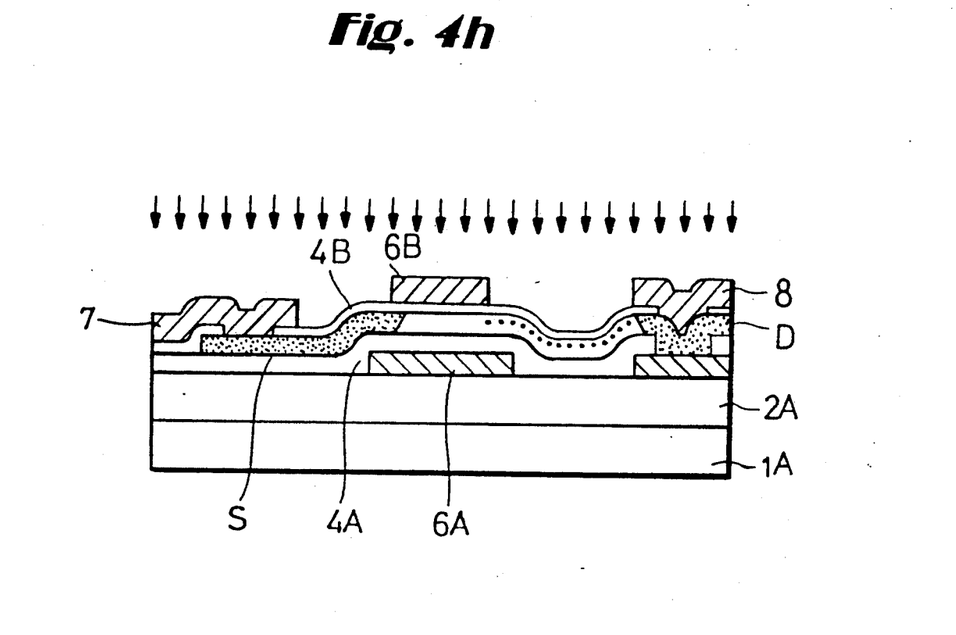

In this example, following the photoresist removal, an ion implantation with low concentration impurity is performed as shown in FIG. 4(h) to form a self-aligned asymmetrical lightly doped drain (ALDD) TFT structure. This concentration is adjusted to optimize the device characteristics to be exhibited, but typically of about $\sim 10^{13}$ cm$^{-2}$ in the case of boron.

Polysilicon TFT is an inexpensive device and widely used in LCD, SRAM, 3-D integrated circuits and the like. However, the high density of defects in the thin film transistor body makes the TFT very leaky as compared with transistors fabricated in a single crystal semiconductor. The leakage current in polysilicon MOS TFT is due to the electric field enhanced generation-recombination at the drain P-N junction induced by the high electric field which is capacitively coupled with the gate electrode. According to the self-aligned asymmetrical LDD or self-aligned asymmetrical drain offset TFT structure of the present invention, the enhanced generation-recombination of electric field is remarkably suppressed which results in decreased OFF current.

That is, in the structures of the present invention, the drain region and the channel region are isolated by the drain-offset region, so as to reduce the electric field intensity thereby decreasing the OFF current.

Also, the top gate electrode allows the source region to be defined in self-aligned manner thereby eliminating the source parasitic series resistances which reduce the ON (drive) current of the TFT.

Furthermore, the drain offset region is easily and precisely defined in self-aligned manner by the use of a photoresist mask which overlaps the previously formed gate and drain electrodes.

In summary, using the TFT structures of the present invention allows a high performance polysilicon MOS TFT with lower OFF current, high ON/OFF ratio and good controllability of its characteristics, to be realized and fabricated with improved yield and reduced cost.

What we claimed is:

1. A method of making a thin film transistor having a self-aligned asymmetrical structure, said method comprising:
    forming a semiconductor thin film over a substrate, said thin film being formed to include a drain region, a channel region and a partial source region, said drain and partial source regions being of one conductivity type and said channel region being of another conductivity type;
    forming a gate electrode over said channel region and a pair of electrodes including a drain electrode and a source electrode, said drain electrode being concurrently formed with the formation of said gate electrode by the same layer forming said gate electrode, whereby a drain-offset region is formed between said gate electrode and drain electrode;
    completing the formation of the source region in a self-aligned manner by ion implantation using said source electrode and gate electrode as a mask.

2. A method as in claim 1, said method further comprising:
    forming a second gate on said substrate prior to forming said semiconductor thin film over said substrate.

3. A method as in claim 1 in which said semiconductor thin film has a thickness of 20 to 60 nm.

4. A method as in claim 1, wherein an ion is implanted in low concentration in said drain-offset region using said gate electrode and drain electrode as a mask after completing the formation of the source region.

5. A method as in claim 1, wherein said drain-offset region is formed between said channel region and said drain region in a self-aligned manner by ion implantation using said gate and drain electrodes as a mask.

6. A method as in claim 1, wherein said source is formed concurrently with the formation of said gate electrode and drain electrode by the same layer forming said gate electrode and drain electrode.

7. A method as in claim 1, wherein said drain-offset region is covered with a mask upon completing the formation of the source region.

8. A method as in claim 7, wherein said drain-offset region is of the same conductivity type as said drain region.

9. A method as in claim 7, wherein said drain-offset region is of the same conductivity type as said channel region.

* * * * *